US009523923B2

(12) United States Patent
Deguenther

(10) Patent No.: US 9,523,923 B2
(45) Date of Patent: Dec. 20, 2016

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventor: Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 244 days.

(21) Appl. No.: 14/274,129

(22) Filed: May 9, 2014

(65) Prior Publication Data

US 2014/0247437 A1    Sep. 4, 2014

Related U.S. Application Data

(63) Continuation of application No. 13/005,833, filed on Jan. 13, 2011, now Pat. No. 8,755,031, which is a
(Continued)

(30) Foreign Application Priority Data

Jul. 16, 2008 (EP) .................................... 08012815

(51) Int. Cl.
*G03F 7/20* (2006.01)
*G02B 26/02* (2006.01)
(Continued)

(52) U.S. Cl.
CPC ........... *G03F 7/70141* (2013.01); *G02B 26/02* (2013.01); *G02B 26/101* (2013.01); *G03F 7/702* (2013.01);
(Continued)

(58) Field of Classification Search
CPC ... G02B 26/02; G02B 26/0833; G02B 26/101; G03F 7/70066; G03F 7/70075; G03F 7/70116; G03F 7/70141; G03F 7/70158; G03F 7/702
See application file for complete search history.

(56) References Cited

U.S. PATENT DOCUMENTS 6,438,199 B1    8/2002  Schultz et al.
6,741,394 B1 *  5/2004  Tanitsu ............... B41M 5/5272
                                              359/619
(Continued)

FOREIGN PATENT DOCUMENTS

EP         1 262 836 A1    12/2002
JP         2002-221756      8/2002
(Continued)

OTHER PUBLICATIONS

The International Search Report for corresponding PCT Application No. PCT/EP2009/004574, dated Oct. 27, 2009.
(Continued)

*Primary Examiner* — Steven H Whitesell Gordon
(74) *Attorney, Agent, or Firm* — Fish & Richardson P.C.

(57) ABSTRACT

An illumination system of a microlithographic projection exposure apparatus includes an optical raster element configured to produce a plurality of secondary light sources located in a system pupil surface. The optical raster element has a plurality of light entrance facets, each being associated with one of the secondary light sources. A beam deflecting device includes a beam deflection array of reflective or transparent beam deflecting elements, each being configured to illuminate a spot on one of the light entrance facets at a position that is variable by changing a deflection angle produced by the beam deflecting element. A control unit is configured to control the beam deflection elements such that
(Continued)

variable light patterns assembled from the spots can be formed on at least one of the plurality of light entrance facets.

21 Claims, 9 Drawing Sheets

Related U.S. Application Data continuation of application No. PCT/EP2009/004574, filed on Jun. 25, 2009.

(60) Provisional application No. 61/081,163, filed on Jul. 16, 2008.

(51) Int. Cl.
*G02B 26/10* (2006.01)
*G02B 26/08* (2006.01)

(52) U.S. Cl.
CPC ....... *G03F 7/70066* (2013.01); *G03F 7/70075* (2013.01); *G03F 7/70116* (2013.01); *G03F 7/70158* (2013.01); *G02B 26/0833* (2013.01)

(56) References Cited

U.S. PATENT DOCUMENTS

| | | | |
|---|---|---|---|
| 7,061,582 B2 | 6/2006 | Zinn et al. | |
| 8,755,031 B2 | 6/2014 | Deguenther | |
| 2002/0109827 A1 | 8/2002 | Nishi | |
| 2002/0136351 A1 | 9/2002 | Singer | |
| 2003/0002022 A1 | 1/2003 | Schultz | |
| 2003/0227603 A1 | 12/2003 | Dierichs | |
| 2004/0036977 A1 | 2/2004 | Tanaka et al. | |
| 2005/0018294 A1 | 1/2005 | Hauschild et al. | |
| 2006/0087634 A1 | 4/2006 | Brown et al. | |
| 2007/0146853 A1 | 6/2007 | Singer et al. | |
| 2008/0123807 A1 | 5/2008 | Warm et al. | |
| 2009/0021715 A1 | 1/2009 | Deguenther et al. | |
| 2009/0021716 A1 | 1/2009 | Wangler et al. | |
| 2010/0195077 A1 | 8/2010 | Koehler et al. | |
| 2011/0122388 A1 | 5/2011 | Deguenther | |

FOREIGN PATENT DOCUMENTS

| | | |
|---|---|---|
| JP | 2003-149736 | 5/2003 |
| JP | 2007-505488 | 3/2007 |
| WO | WO 2005/026843 | 3/2005 |
| WO | WO 2005/078522 | 8/2005 |
| WO | WO 2007093433 | 8/2007 |
| WO | WO 2008/131928 | 11/2008 |

OTHER PUBLICATIONS

Japanese Office Action, with translation thereof, for corresponding JP Appl No. 2011-517771, dated Mar. 21, 2013.

* cited by examiner

ILLUMINATION SYSTEM OF A MICROLITHOGRAPHIC PROJECTION EXPOSURE APPARATUS

CROSS-RELATED APPLICATIONS

This application is a continuation of, and claims benefit under 35 USC 120 to, U.S. application Ser. No. 13/005,833, filed Jan. 13, 2011, which is a continuation of international application PCT/EP2009/004574, filed Jun. 25, 2009, which claims benefit of European Application No. 08012815.0, filed Jul. 16, 2008 and U.S. Ser. No. 61/081,163, filed Jul. 16, 2008. U.S. application Ser. No. 13/005,833 and international application PCT/EP2009/004574 are hereby incorporated by reference in their entirety.

FIELD

The disclosure generally relates to illumination systems for illuminating a mask in microlithographic exposure apparatus, and in particular to such systems including an array of mirrors or other beam deflecting elements. The disclosure also relates to a method of operating such systems.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective, and a wafer alignment stage for aligning the wafer coated with the photoresist. The illumination system illuminates a field on the mask that may have the shape of a rectangular or curved slit, for example.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam along a scan direction while synchronously moving the substrate parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning mechanism. Commonly used masks contain transmissive or reflective patterns and may be of the binary, alternating phase-shift, attenuated phase-shift or various hybrid mask type, for example. However, there are also active masks, e.g. masks realized as a programmable mirror array. Also programmable LCD arrays may be used as active masks.

As the technology for manufacturing microstructured devices advances, there are ever increasing demands also on the illumination system. Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions of the rays that constitute the light bundle.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a system pupil surface of the illumination system. With an annular illumination setting, for example, only an annular region is illuminated in the system pupil surface. Thus there is only a small range of angles present in the angular distribution of the projection light, and thus all light rays impinge obliquely with similar angles onto the mask.

Different approaches are known in the art to modify the angular distribution of the projection light in the mask plane so as to achieve the desired illumination setting. In the simplest case a stop (diaphragm) including one or more apertures is positioned in a pupil surface of the illumination system. Since locations in a pupil surface translate into angles in a Fourier related field plane such as the mask plane, the size, shape and location of the aperture(s) in the system pupil surface determines the angular distributions in the mask plane. However, any change of the illumination setting involves a replacement of the stop. This makes it difficult to finally adjust the illumination setting, because this would involve a very large number of stops that have aperture(s) with slightly different sizes, shapes or locations.

Many common illumination systems therefore include adjustable elements that make it possible, at least to a certain extent, to continuously vary the illumination of the pupil surface. Conventionally, a zoom axicon system including a zoom objective and a pair of axicon elements are used for this purpose. An axicon element is a refractive lens that has a conical surface on one side and is usually plane on the opposite side. By providing a pair of such elements, one having a convex conical surface and the other a complementary concave conical surface, it is possible to radially shift light energy. The shift is a function of the distance between the axicon elements. The zoom objective makes it possible to alter the size of the illuminated area in the pupil surface.

For further increasing the flexibility in producing different angular distribution in the mask plane, it has been proposed to use mirror arrays that illuminate the pupil surface. In EP 1 262 836 A1 the mirror array is realized as a microelectromechanical system (MEMS) including more than 1000 microscopic mirrors. Each of the mirrors can be tilted in two different planes perpendicular to each other. Thus radiation incident on such a mirror device can be reflected into (substantially) any desired direction of a hemisphere. A condenser lens arranged between the mirror array and the pupil surface translates the reflection angles produced by the mirrors into locations in the pupil surface. This known illumination system makes it possible to illuminate the pupil surface with a plurality of circular spots, wherein each spot is associated with one particular microscopic mirror and is freely movable across the pupil surface by tilting this mirror.

Illumination systems are also known from, for example, US 2006/0087634 A1, U.S. Pat. No. 7,061,582 B2 and WO 2005/026843 A2.

The geometry of the field illuminated in the mask plane is usually determined by a plurality of components. One of the most important components in this respect is an optical raster element which produces a plurality of secondary light sources in the system pupil plane. The angular distribution of the light bundles emitted by the secondary light sources is directly related to the geometry of the field illuminated in the mask plane. By suitably determining the optical properties of the optical raster element, for example the refractive power in orthogonal directions, it is possible to obtain the desired field geometry.

Usually it is desired that the geometry of the illuminated field can be varied at least to a certain extent. Since the optical properties of the optical raster element cannot be changed easily, a field stop is provided that is imaged by a field stop objective on the mask. The field stop usually includes a plurality of blades that can be individually moved so as to delimit the field illuminated in the mask. The field stop also ensures sharp edges of the illuminated field. In apparatus of the scanner type an adjustable field stop is used to open and shut the illuminated field at the beginning and the end of each scan process, respectively.

If the geometry of the illuminated field is varied with the help of an adjustable field stop, light losses are inevitable because a portion of the projection light is blocked by the blades of the field stop.

SUMMARY

The disclosure provides an illumination system which makes it possible to vary the geometry of the illuminated field with smaller light losses.

In some embodiments, an illumination system includes a primary light source, a system pupil surface, and a mask plane in which a mask to be illuminated can be arranged. The system further includes an optical raster element which is configured to produce a plurality of secondary light sources located in the system pupil surface. The optical raster element has a plurality of light entrance facets each being associated with one of the secondary light sources. A beam deflecting device of the illumination system includes a beam deflection array of reflective or transparent beam deflecting elements. Each beam deflecting element is configured to illuminate a spot on one of the light entrance facets at a position that is variable by changing a deflection angle produced by the beam deflection element. A control unit is configured to control the beam deflection elements such that variable light patterns assembled from the spots can be formed on at least one of the plurality of light entrance facets.

The disclosure exploits the fact that locations on the light facets of the optical raster element translate into angles of the light emitted by the secondary light sources. Thus each light pattern illuminated on a facet is associated with a different angular distribution of light emitted by the secondary light source associated with the light entrance facet. Since the angular distribution of a secondary light source translates back into a geometry of the illuminated field in the mask plane, the light patterns illuminated on the light entrance facets have a one to one correspondence to the geometry of the illuminated field in the mask plane. In the absence of optical aberrations, the illuminated field is a superposition of images of the light patterns formed on the light entrance facets of the optical raster element.

The provision of the beam deflecting device makes it possible to accurately vary the locations of the spots which are illuminated on the light entrance facets of the optical raster element. In order to produce different light patterns, the spots illuminated by the beam deflecting elements have a total area that is sufficiently smaller than a maximum total area of a light entrance facet. Preferably the spot area is at least 5 times, more preferably at least 10 times, and most preferably at least 20 times, smaller than the maximum total area of any of the light entrance facets.

In contrast to certain known illumination systems including beam deflection devices, in which the spots are determined such that they at least substantially illuminate the complete area of the light entrance facets, the substantially smaller spot size of the present disclosure (if compared to the area of the facets) makes it possible to produce a kind of illuminated fine structure on the optical raster element in which the geometry of the illuminated field is encoded.

By changing this fine structure, the geometry of the illuminated field may be varied without incurring substantial light losses, as would be the case if an adjustable field stop is used to this end. It is even possible to completely dispense with the field stop and also with the field stop objective, which considerably simplifies the overall layout of the illumination system. If a field stop is nevertheless provided, the varying geometry will be mainly determined by the beam deflecting device, whereas the field stop only ensures sharp edges, but blocks only a very small portion of the projection light.

The spots illuminated by the beam deflecting elements on the light entrance facets may have any arbitrary geometry. These geometries do not have to be identical for all spots.

For example, rectangular spots with a different spot size, or a mixture of rectangular and triangular spots may be envisaged. Preferably the spots have geometries that can be assembled to larger areas such that no or very small gaps remain between adjacent spots. Usually the geometry of the spots illuminated on the light entrance facets depends mainly on the angular distribution of the light impinging on the micro-mirrors. An array of micro-lenses arranged in front of the micro-mirrors may be used to produce an angular distribution that results in the desired spot geometry.

In one embodiment the spots have an at least substantially rectangular geometry. This is advantageous because such spots can be lined up along lines which may then (subsequently) combine to larger rectangular areas illuminated on a single light entrance facet.

Usually it will be preferred if, at a given instant, the light patterns produced on all illuminated light entrance facets are identical. This ensures that all secondary light sources illuminate the same field in the mask plane so that the intensity is at least substantially identical throughout the illuminated field. However, in other cases it may be desired to have a certain intensity profile within the illuminated field. For example, in some projection exposure apparatus of the scanner type it is desired to have an intensity profile with a smoothly increasing and decreasing intensity at the edges extending perpendicular to a scan direction of the apparatus.

In this case there should be different light patterns on the illuminated light entrance facets at a given instant.

In one embodiment the control unit is configured to control the beam deflection elements such that the lengths of the light patterns along the scan direction are gradually varied during a scan process of the apparatus, whereas the length of the light patterns along a direction perpendicular to the scan direction remains constant. This may be used to imitate the function of an adjustable field stop at the beginning and the end of each scan process.

If a pulsed laser is used as a primary light source in the illumination system, the variation of the light patterns should be synchronized with the pulse rate of the laser.

Such a synchronization may not be necessary if at least some of the light entrance facets are provided with blinds. This makes it possible to continuously move the light entrance patterns over the light entrance facets so that the blinds will gradually obstruct more and more of the spots. This, in turn, results in a gradual reduction of the size of the light patterns and thus of the field illuminated in the mask plane.

In this context it may be envisaged that at least one light entrance facet is provided with a pair of blinds that are arranged on opposite sides of the light entrance facet. Such a configuration is particularly useful if the illuminated field has to increase and to decrease along the scan direction at the beginning and the end, respectively, of the scan process.

According to some embodiments, the illumination system includes a diaphragm which is arranged in close proximity to the beam deflection device. An actuator is provided for moving the diaphragm parallel to the scan direction of a microlithographic projection exposure apparatus. If the diaphragm moves continuously or intermittently into the light bundles associated with the beam deflection elements, an increasing or decreasing portion of these light bundles will be blocked by the diaphragm. If, for example, first those light bundles are blocked that contribute exclusively to the illumination of a certain area in the field illuminated on the mask, this area will become dark if the diaphragm starts moving. In one embodiment this area is a line extending perpendicular to the scan direction so that the movement of the diaphragm results in the typical field geometry variation at the beginning and the end of each scan process.

The beam deflection elements may be configured as mirrors which can be tilted by two tilt axes forming an angle therebetween. In another embodiment, the beam deflection elements are electro-optical or acousto-optical elements.

In some embodiments, the disclosure provides a method that includes:
a) providing an illumination system of a microlithographic projection exposure apparatus, wherein the illumination system includes an optical raster element having a plurality of light entrance facets;
b) producing light patterns, which are assembled from individual spots, on the light entrance facets of the optical raster element;
c) determining that the geometry of a field to be illuminated in a mask plane shall change;
d) varying the light patterns on the light entrance facets by rearranging and/or removal and/or adding spots.

The remarks made above relating to the illumination system according to the present disclosure also apply as appropriate to the methods.

BRIEF DESCRIPTION OF THE DRAWINGS

Various features and advantages of the present disclosure may be more readily understood with reference to the following detailed description taken in conjunction with the accompanying drawing in which.

DESCRIPTION OF PREFERRED EMBODIMENTS

I. General Structure of Projection Exposure Apparatus

Figure 1:
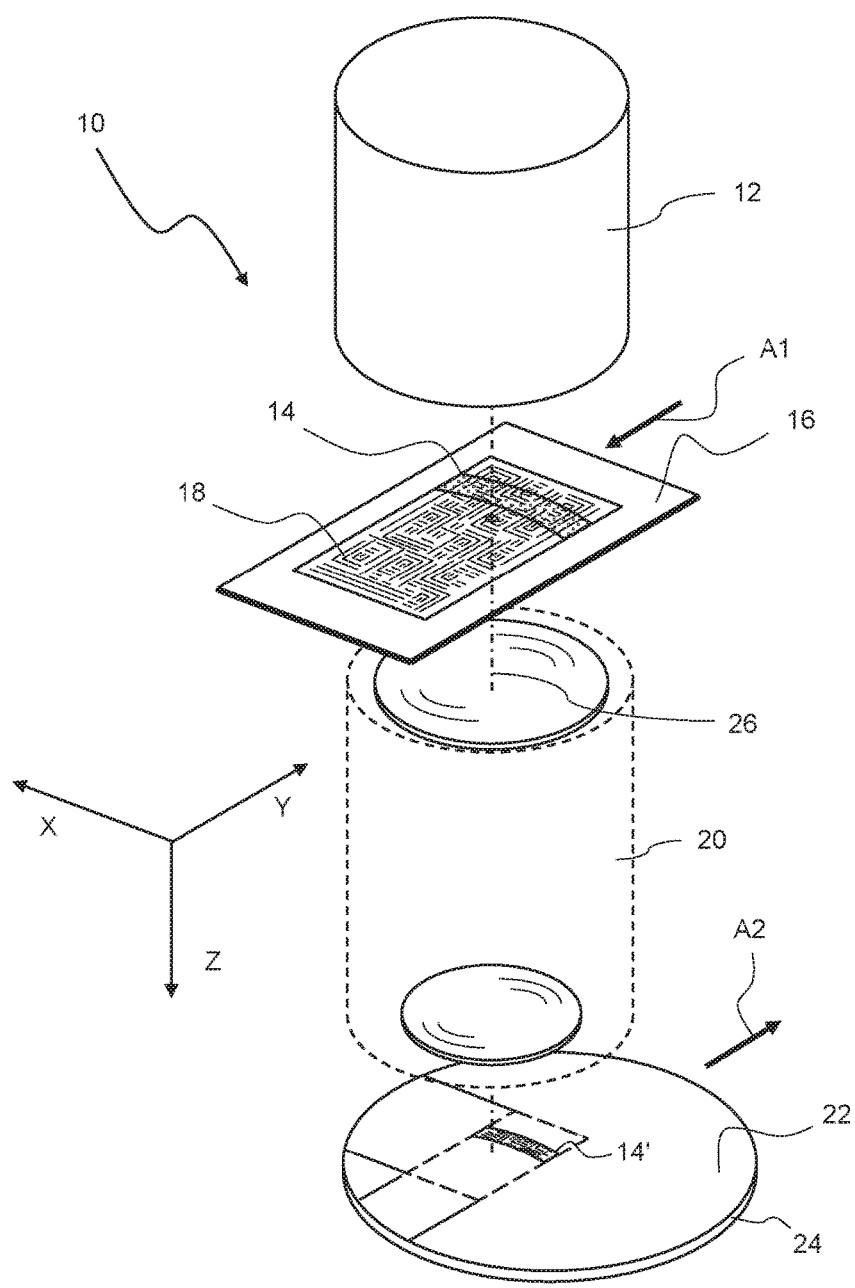
FIG. 1 is a perspective and considerably simplified view of a projection exposure apparatus in accordance with the present disclosure.

FIG. 1 is a perspective and highly simplified view of a projection exposure apparatus 10 that includes an illumination system 12 for producing a projection light beam. The projection light beam illuminates a field 14 on a mask 16 containing minute structures 18. In this embodiment the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is deposited on a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification of less than 1, a minified image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan apparatus" or simply a "scanner". The ratio between the velocities of the mask 16 and the substrate 24 is equal to the magnification of the projection objective 20. If the projection objective 20 inverts the image, the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

In the embodiment shown, the illuminated field 14 is not centered with respect to an optical axis 26 of the projection objective 20. Such an off-axis illuminated field 14 may be desirable with certain types of projection objectives 20. In other embodiments, the illuminated field 14 is centered with respect to the optical axis 26.

II. General Structure of Illumination System

Figure 2:
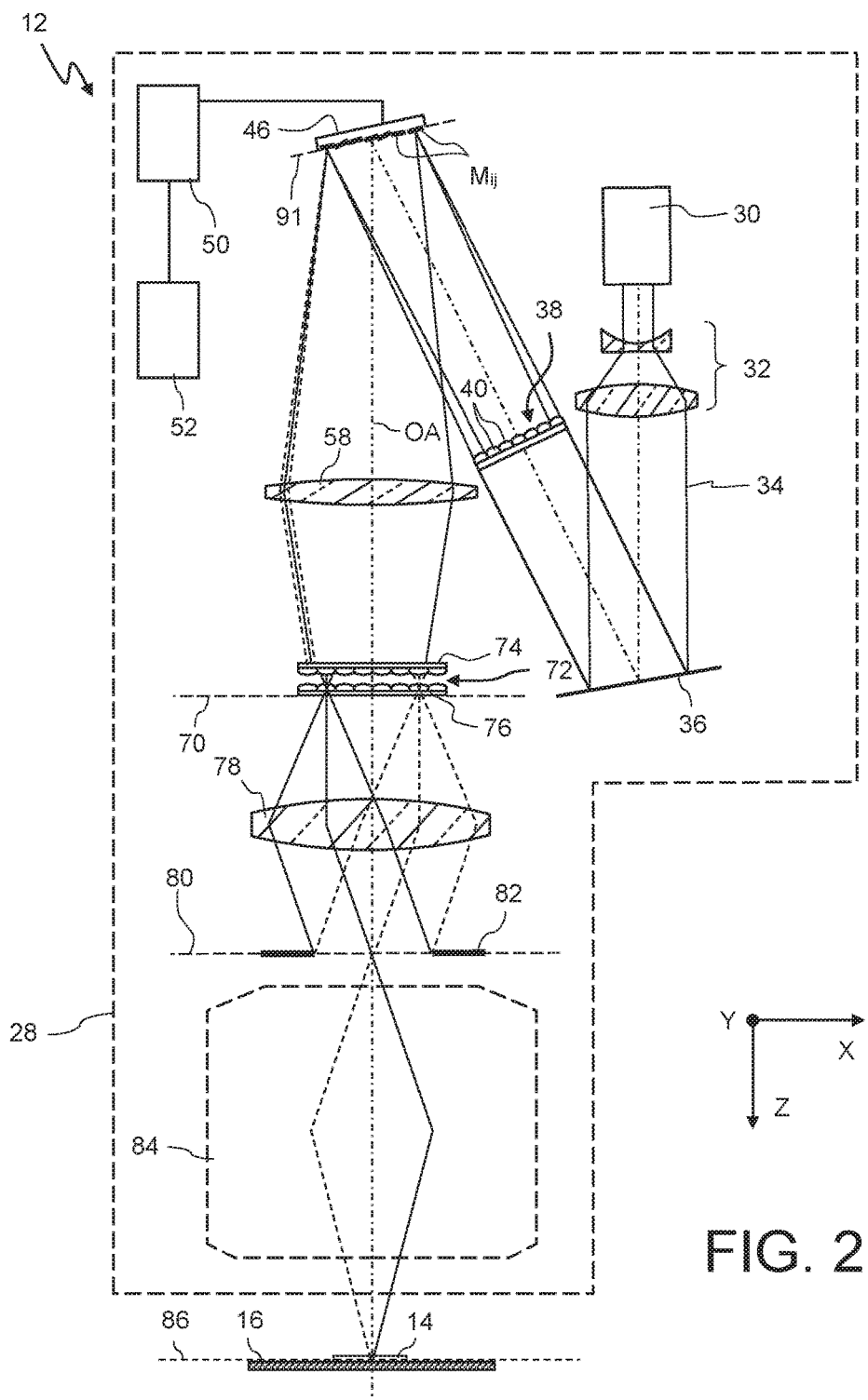
FIG. 2 is a meridional section through an illumination system contained in the projection exposure apparatus shown in FIG. 1.

FIG. 2 is a more detailed meridional section through the illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wavelengths, for example 248 nm or 157 nm, are also contemplated.

In the embodiment shown, the projection light emitted by the excimer laser 30 enters a beam expansion unit 32 in which the light beam is expanded without altering the geometrical optical flux. The beam expansion unit 32 may include several lenses as shown in FIG. 2, or may be realized as a mirror arrangement, for example. The projection light emerges from the beam expansion unit 32 as a substantially collimated beam 34. In other embodiments, this beam may have a significant divergence. The collimated beam 34 impinges on a plane folding mirror 36 provided for reducing the overall dimensions of the illumination system 12.

After reflection from the folding mirror 36, the beam 34 impinges on an array 38 of microlenses 40. A mirror array 46 is arranged in or in the vicinity to a back focal plane 91 of the microlenses 40. As will be explained in more detail below, the mirror array 46 includes a plurality of small individual mirror elements $M_{ij}$ that can be tilted, independently from each other, by two tilt axes that are preferably aligned perpendicularly to each other. The total number of mirror elements $M_{ij}$ may exceed 100 or even several 1000. The reflecting surfaces of the mirror elements $M_{ij}$ may be plane, but could also be curved, if an additional reflective power is desired. Apart from that, the mirror surfaces could be provided with diffractive structures. In this embodiment the number of mirror elements $M_{ij}$ is equal to the number of microlenses 40 contained in the microlens array 38. Thus each microlens 40 directs a converging light bundle on one mirror element $M_{ij}$ of the mirror array 46.

The tilting movements of the individual mirror elements $M_{ij}$ are controlled by a mirror control unit 50 which is connected to an overall system control 52 of the illumination system 12. Actuators that are used to set the desired tilt angles of the mirror elements $M_{ij}$ receive control signals from the mirror control unit 50 such that each individual mirror element $M_{ij}$ is capable of reflecting an impinging light ray by a reflection angle that is variable in response to the control signal. In the embodiment shown there is a continuous range of tilt angles at which the individual mirror elements $M_{ij}$ can be arranged. In other embodiments, the actuators are configured such that only a limited number of discrete tilt angles can be set.

Figure 3:
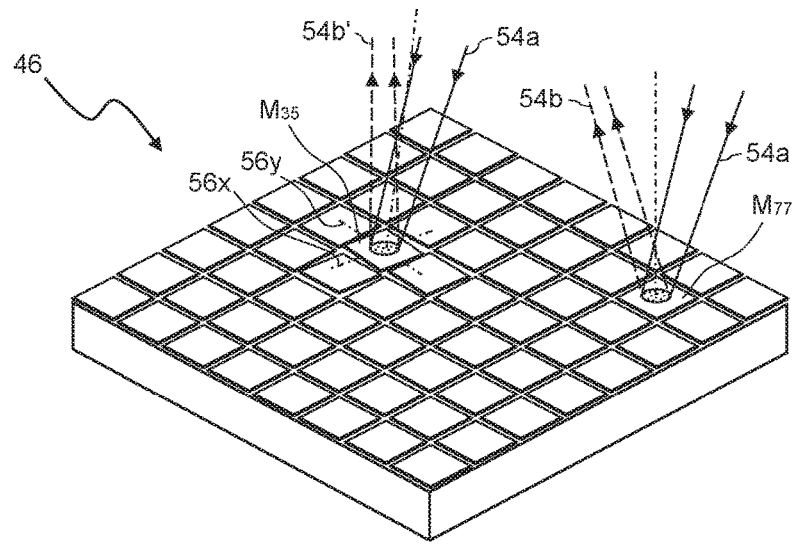
FIG. 3 is a perspective view of a mirror array contained in the illumination system of FIG. 2.

FIG. 3 is a perspective view of the mirror array 46 including, for the sake of simplicity, only 8·8=64 mirror elements $M_{ij}$. Light bundles 54a impinging on the mirror array 46 are reflected to different directions depending on the tilt angles of the mirror elements $M_{ij}$. In this schematic representation it is assumed that a particular mirror element $M_{35}$ is tilted about two tilt axes 56x, 56y relative to another mirror element $M_{77}$ so that the light bundles 54b, 54b' which are reflected by the mirror elements $M_{35}$ and $M_{77}$, respectively, are reflected into different directions.

The mirror array 46 may be replaced by any other deflective structure that makes it possible to direct light rays impinging on the structure into various directions, wherein the directions can be changed individually for different portions of the structure upon application of a suitable control signal. Such alternative structures may include, for example, electro-optical or acousto-optical elements. In such elements the refractive index may be varied by exposing a suitable material to ultrasonic waves or electric fields, respectively. These effects can be exploited to produce index gratings that direct impinging light into various directions.

Referring again to FIG. 2, the light bundles reflected from the mirror element $M_{ij}$ impinge on a first condenser 58 which ensures that the slightly diverging light bundles impinge, now as at least substantially parallel light bundles, on an optical integrator 72 which produces a plurality of secondary light sources. The optical integrator 72 increases the range of angles formed between the light rays and an optical axis OA of the illumination system 12. In other embodiments, the first condenser 58 is dispensed with so that the light bundles impinging on the optical integrator 72 have a larger divergence.

The optical integrator 72 is realized, in the embodiment shown, as a fly's eye lens including two substrates 74, 76 that each includes two orthogonal arrays of parallel cylindrical microlenses. Other configurations of the optical integrator are envisaged as well, for example integrators including an array of microlenses that have rotationally symmetrical surfaces, but rectangular boundaries. Reference is made to WO 2005/078522 A, US 2004/0036977 A1 and US 2005/0018294 A1, in which various types of optical integrators suitable for the illumination system 12 are described. The function of the optical integrator 72 will be explained in more detail further below with reference to FIGS. 5a and 5b.

Reference numeral 70 denotes a system pupil surface of the illumination system 12 that substantially defines the angular distribution of the light impinging on the mask 14. The system pupil surface 70 is usually plane or slightly curved and is arranged in or in immediate vicinity to the optical integrator 72. As the angular light distribution in the system pupil surface 70 directly translates into an intensity distribution in a subsequent field plane, the optical integrator 72 substantially determines the basic geometry of the illuminated field 14 on the mask 16. Since the optical integrator 72 increases the range of angles considerably more in the X direction than in the scan direction Y, the illuminated field 14 has larger dimensions along the X direction than along the scan direction Y.

The projection light emerging from the secondary light sources produced by the optical integrator 72 enters a second condenser 78 that is represented in FIG. 2 by a single lens only for the sake of simplicity. The second condenser 78 ensures a Fourier relationship between the system pupil surface 70 and a subsequent intermediate field plane 80 in which a field stop 82 is arranged. The second condenser 78 superimposes the light bundles, which are produced by the secondary light sources, in the intermediate field plane 80, thereby achieving a very homogenous illumination of the intermediate field plane 80. The field stop 82 may include a plurality of movable blades and ensures sharp edges of the illuminated field 14 on the mask 16. Blades are not only moved when a new mask having different dimensions shall be projected, but also at the beginning and the end of each scan process in order to ensure that each point on the mask 16 receives the same amount of light energy.

A field stop objective 84 provides optical conjugation between the intermediate field plane 80 and the mask plane 86 in which the mask 16 is arranged. The field stop 82 is thus sharply imaged by the field stop objective 84 onto the mask 16. As will be explained further below, the field stop 82 and the field stop objective 84 may be dispensed with in other embodiments.

III. Function and Control of the Illumination System

Figure 4:
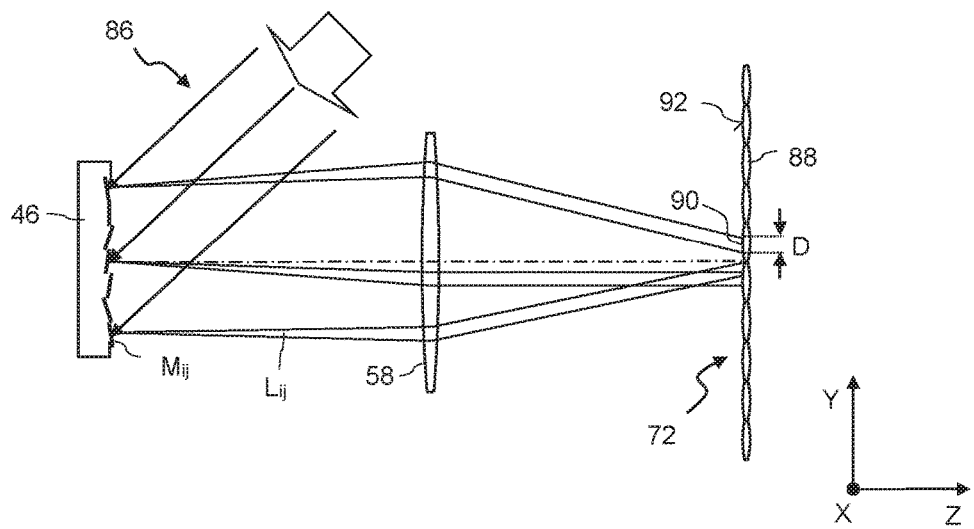
FIG. 4 is an enlarged cut-out of FIG. 2 showing the mirror array of FIG. 3 and first microlenses of an optical raster element.

FIG. 4 is a cut-out of FIG. 2 showing the mirror array 46, the first condenser 58 and first microlenses 88 formed on the first substrate 74 of the optical integrator 72. In this embodiment the microlenses 88 are rotationally symmetrical but have square borderlines. In other embodiments each microlens is formed by crossing two cylindrical microlenses.

As is illustrated in FIG. 4, each mirror element $M_{ij}$ produces a light bundle $L_{ij}$ which illuminates a small spot 90 on a light entrance facet 92 of one of the first microlenses 88. The position of the spots may be varied by tilting the mirror elements $M_{ij}$. The geometry of the spots 90 depends on, among other things, the optical properties of the microlenses 40 of the array 38 and the optical properties of the mirror elements $M_{ij}$. In some embodiments the geometry of the spots 90 is circular; in other embodiments described further below the geometry is approximately rectangular and in particular square.

As can be seen in FIG. 4, the diameter D of the spots 90 is smaller than the diameter of the entrance facet 92 of the illuminated first microlens 88. Generally the total area of each spot 90 illuminated on a light entrance facet 92 of a first microlens 88 should be considerably, for example at least 5 times, preferably at least 10 times, more preferably at least 20 times, smaller than the area of the respective light entrance facet 92. If the light entrance facets 92 have different areas and each spot 90 can be produced on any of these facets, the maximum area of the light entrance facet 92 may be taken as reference. If the spots 90 are sufficiently small in comparison to the light entrance facets 92 of the first microlenses 88, it is possible to produce different light patterns on the light entrance facets 92. The light patterns may be easily varied by suitably controlling the mirror elements $M_{ij}$ with the help of the mirror control unit 50.

Figure 5A:
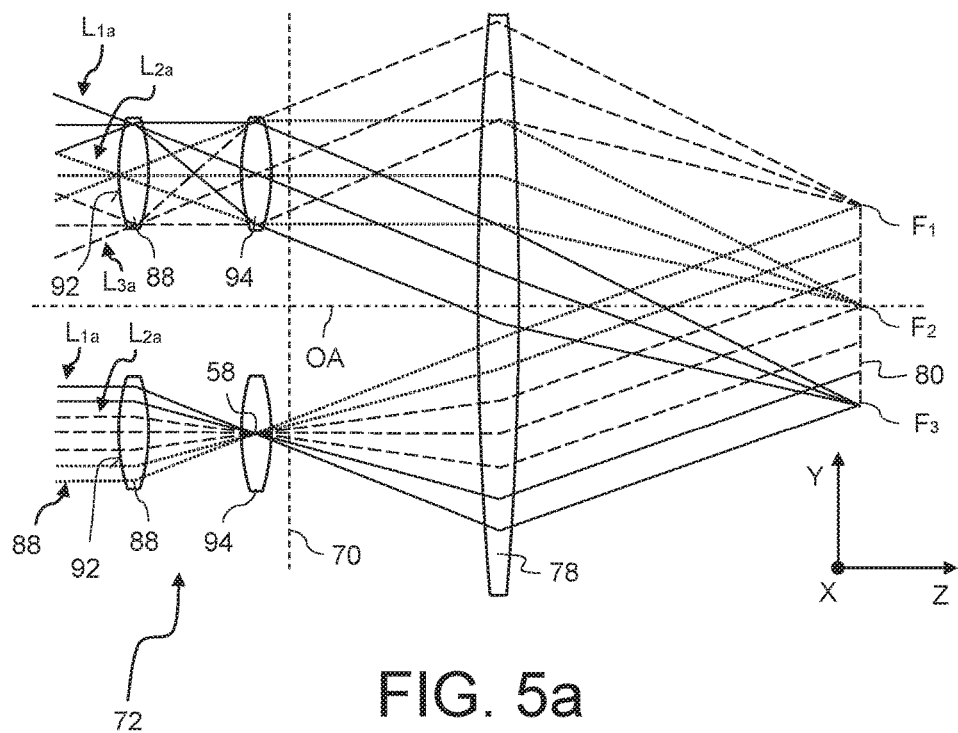
FIG. 5a is an enlarged cut-out of FIG. 2 showing first and second microlenses of the optical raster element and a condenser lens.

The effect produced by illuminating different light patterns on the light entrance facets 92 is elucidated with reference to FIG. 5a. This figure is an enlarged and not to scale cut-out of FIG. 2 showing the optical integrator 72, the second condenser 78 and the intermediate field plane 80. From the optical integrator 72 only two pairs of a first microlens 88 and a second microlens 94 are illustrated for the sake of simplicity. Again, the microlenses 88, 94, which are sometimes also referred to as field and pupil honeycomb lenses, may be configured as individual microlenses having rotationally symmetrical refractive surfaces and a rectangular borderline, or as crossed cylindrical microlenses as shown in FIG. 2, for example. Microlenses 88, 94 have at least along one direction perpendicular to an optical axis OA of the illumination system 12 a none-zero optical power.

Each pair of adjacent microlenses 88, 94 produces a secondary light source. In the upper half of FIG. 5a it is assumed that converging light bundles $L_{1a}$, $L_{2a}$ and $L_{3a}$ illustrated with solid, dotted and broken lines, respectively, impinge on different points of the light entrance facet 92 of the first microlens 88. After having passed the two microlenses 88, 94 and the condenser 78, each light bundle $L_{1a}$, $L_{2a}$ and $L_{3a}$ converges to a focal point $F_1$, $F_2$ and $F_3$, respectively. From the upper half of FIG. 5a it thus becomes clear that there is a one to one correspondence between the position where a light ray impinges on the light entrance facet 92 on the one hand and the position where this light ray passes the intermediate field plane 80 (or any other conjugated field plane). As a result, the dimension of the field illuminated in the intermediate field plane 80 (and thus the field 14 illuminated in the mask plane 86) can be varied by changing the region illuminated on the light entrance facet of the first microlens 88. This region can be changed very effectively with the help of the mirror device 46, as has been explained above with reference to FIG. 4.

As a matter of course, these considerations apply separately for the X and the Y direction. Thus the geometry of the illuminated field 14 can be varied independently for the X and Y direction by varying the illumination of the light entrance facets 92 separately for the X and Y direction, respectively. In other words, almost any arbitrary geometry of the illuminated field in the intermediate field plane 80 can be achieved if the area illuminated on the light entrance facet 92 of the first microlens 88 is suitably determined.

The lower half of FIG. 5a illustrates the case where collimated light bundles $L_{1b}$, $L_{2b}$ and $L_{3b}$ impinge on different regions of the light entrance facet 92 of the first microlens 88. The light bundles are focused in a common focal point F located in the second microlens 94 and then pass, now collimated again, the intermediate field plane 80. Again it can be seen that the region where a light bundle $L_{1b}$, $L_{2b}$ and $L_{3b}$ impinges on the light entrance facet 92 translates into a region which is illuminated in the intermediate field plane.

Figure 5B:
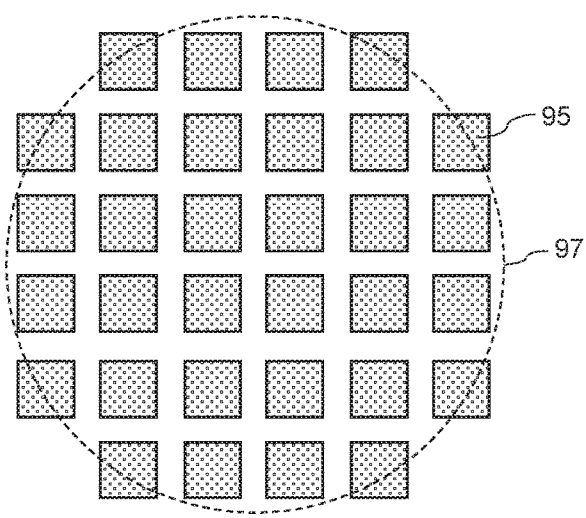
FIG. 5b is a top view on a system pupil surface in which secondary light sources are formed.

In FIG. 5a it is assumed that the system pupil surface 70 is positioned immediately behind the second microlenses 94. In the case of the strongly converging light bundles $L_{1a}$, $L_{2a}$ and $L_{3a}$ as illustrated in the upper half of FIG. 5a, the light bundles $L_{1a}$, $L_{2a}$ and $L_{3a}$ intersect the system pupil plane 70 in a region which is slightly larger than an exit facet of the second microlens 94. In the case of collimated light bundles $L_{1a}$, $L_{2a}$ and $L_{3a}$ as illustrated in the lower half of FIG. 5a, the light bundles $L_{1b}$, $L_{2b}$ and $L_{3b}$ intersect the system pupil plane 70 in a region which is much smaller than an exit facet of the second microlens 94. In many cases the light impinging on the optical integrator 72 is slightly diverging, which corresponds to illumination conditions on the light entrance facets 92 that are somewhere in between what is shown in the upper and the lower half of FIG. 5a. In such cases the secondary light sources may have a geometry as shown in FIG. 5b which is a top view on the system pupil plane 70. The secondary light sources are indicated by squares 95; the circle 97 indicates the clear diameter of the system pupil surface. The light emitted from each secondary light source 95 will usually have different divergences along the X and the Y direction in order to obtain an illuminated field with an aspect ratio distinct from 1.

In the foregoing it has been assumed that all first microlenses 88 are illuminated in the same manner so that the fields illuminated by secondary light sources 95 superimpose. If the intensity in the illuminated field shall not be constant but shall have a certain profile along at least one direction, it is also possible to illuminate the light entrance facets 92 of the first microlenses 88 differently.

Depending on the geometry of the spots 90, it may not be possible to illuminate a continuous region with constant irradiance on the light entrance facet 92 of the first microlenses 88. For example, if the spots have the geometry of a circle, the spots may be arranged on the light entrance facet 92 such that either (small) gaps remain between adjacent spots 90, or such that the spots 90 partially overlap. For that reason the region illuminated on the light entrance facets will be referred to in the following as light pattern which may or may not contain gaps and in which different nonezero intensities may occur if two or more spots 90 completely or partially overlap.

In one embodiment the spots 90 have a square or rectangular geometry such that rectangular light patterns can be produced that have (at least approximately) only one nonezero intensity and no gaps between adjacent spots.

Figure 6:
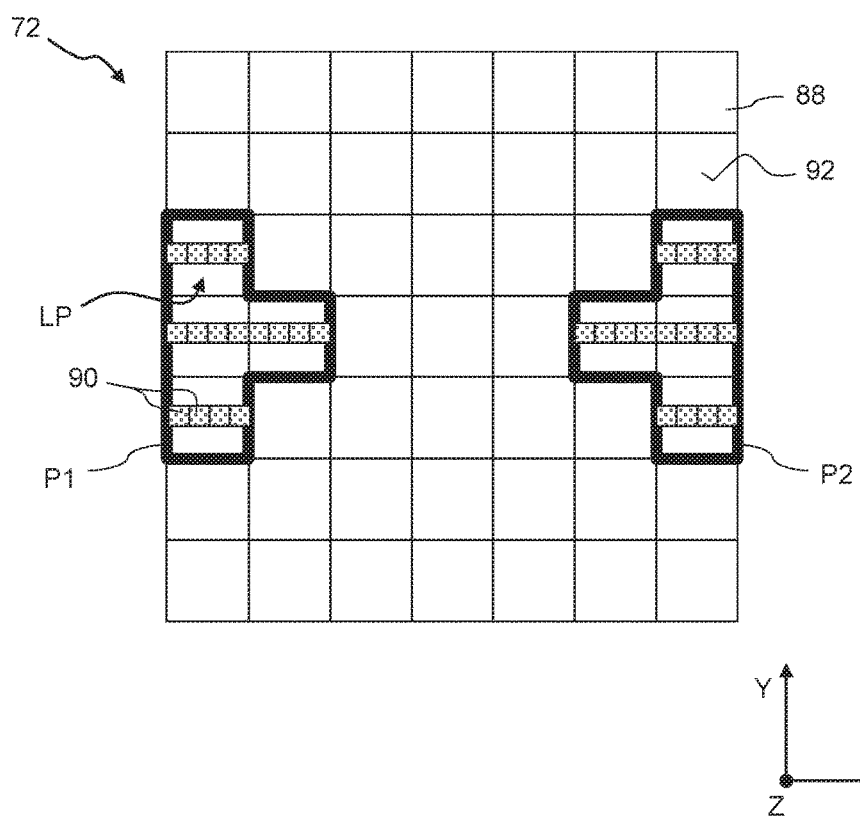
FIG. 6 is a top view on the optical raster element with some light entrance facets illuminated by rectangular light patterns.

This is illustrated in FIG. 6 which is a top view on the optical integrator 72 showing an array of 7·7 first microlenses 88. The borderlines of the first microlenses 88 form a regular grid of squares which each can be individually illuminated with different or identical light patterns. In the configuration shown in FIG. 6 it is assumed that only the light entrance facets 92 located within two poles P1, P2, which are surrounded by thick solid lines, are illuminated. The poles P1, P2 are arranged symmetrically on opposite sides of the optical integrator 72 and are approximately T-shaped.

In contrast to prior art solutions the poles P1, P2 are not completely illuminated, but with an rectangular light pattern LP which is repeated identically on the light entrance facet 92 of each first microlens 88. Each light pattern 94 is, in turn, assembled from square spots 90 which are arranged one behind the other along a line. The aspect ratio of each light pattern 94 is thus 4:1, with the longer side extending along the X direction.

As has been explained above with reference to FIG. 5a, this will result in a field illuminated in the intermediate field plane 80 which has also an aspect ratio of 4:1 (assuming that there are not anamorphotic optical elements in between). If the scan direction of the projection exposure apparatus 10 coincides with the Y direction, an illumination of the optical integrator 72 as shown in FIG. 6 will result in an illuminated field 14 which has its short sides extending along the scan direction Y and the long sides extending along the X direction. Since only light entrance facets 92 within the poles P1, P2 are illuminated, the light will impinge on the intermediate field plane 80 exclusively obliquely from opposite sides, as it is characteristically for a dipole illumination setting.

If the illuminated field shall be half as wide with an aspect ratio of 2:1, for example, the left and right spots 90 in each light pattern LP could be shifted towards the centre so that the two middle positions are illuminated by two spots 90 simultaneously. The illuminated field in the intermediate field plane 80 (and in any subsequent field plane) will then have an aspect ratio of 2:1 as well, but with twice the radiant power, because no light is blocked or lost otherwise in the illumination system 12. If the radiant power shall not be doubled, the left and right spots 90 are simply switched off (e.g. moved away from the optical integrator 72). It has to be noted that a reduction of the field size by changing the light pattern LP does not substantially change the angular distribution of light impinging on the mask 16.

IV. Taking Over Field Stop Function

In illumination systems 12 of projection exposure apparatus 10 of the scanner type the field stop 82 does not only ensure sharp edges (at least along the long sides of the illuminated field extending parallel to the scan direction Y), but it also increases and decreases the length of the illuminated field 14 along the scan direction Y at the beginning and the end of the scan process, respectively. This opening and shutting function is desirable to ensure that all points on the mask receive the same amount of light energy. To this end the field stop 82 is usually provided with blades that can be moved along the scan direction Y.

In the illumination system 12 the geometry of the field can be varied by changing the light patterns illuminated on the light entrance facets 92 of the optical integrator 72. Thus there is, at least in principle, no need for such an adjustable field stop 82. Without the field stop 82 also the field stop objective 84 may be dispensed with, which results in a very considerable simplification of the overall design of the illumination system 12. It is also possible to have a field stop objective 84, but only a simplified field stop 82, for example a stop that delimits only the long edges of the illuminated field 14, while the perpendicular edges are solely determined by the illumination of the optical integrator 72.

If the field stop 82 and the field stop objective 84 shall be dispensed with, the opening and shutting function has to be taken over by the remaining components of the illumination system 12, in particular by the mirror array 46 and its control 50.

1. First Approach

Figure 7:
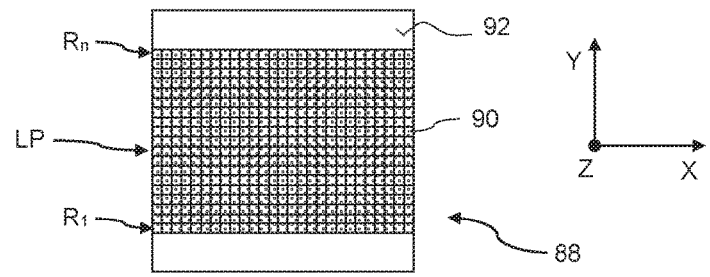
FIG. 7 is a top view on a single light entrance facet illuminated by a rectangular light pattern.

One approach of achieving this will be explained in the following with reference to FIGS. 7 to 9 which show different light patterns on a light entrance facet 92 of a single first microlens 88. FIG. 7 shows the light pattern LP at an instant in the middle of the scan process in which the illuminated field 14 has its maximum extension along the scan direction Y. The light pattern LP has the geometry of a rectangle with an aspect ratio that corresponds, as has been mentioned above, to the aspect ratio of the illuminated field 14 on the mask 16. The rectangular light pattern LP is assembled from n spot rows $R_1$ to $R_n$, wherein each row is assembled from a plurality of spots 90 which are arranged one behind another along a line parallel to the X direction.

At the beginning of a scan process only the line $R_1$ is illuminated for a time interval T during which N light pulses are produced by the light source 30. This is shown in the left illustration of FIG. 8.

Figure 8:
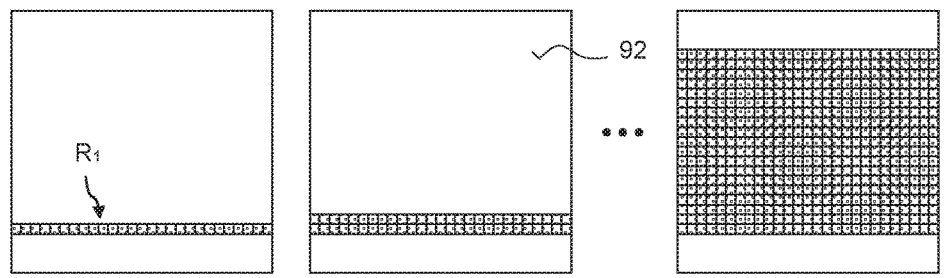
FIG. 8 is a sequence of top views on the light entrance facets shown in FIG. 7, illuminated with different light patterns at the beginning of a scan process.
Figure 9:
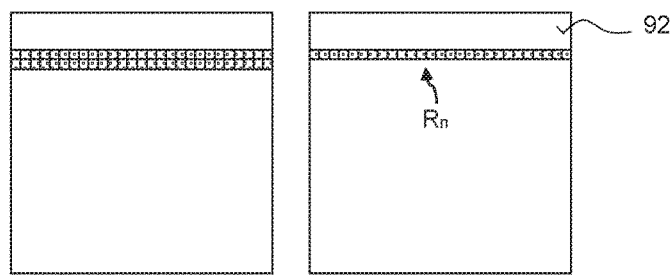
FIG. 9 is a sequence of top views of the light entrance facets shown in FIG. 7, illuminated with different light patterns at the end of a scan process.

Then the second row $R_2$ is additionally illuminated for a time interval T until another N light pulses have impinged on the mask 16, see the middle illustration of FIG. 8. This situation corresponds to a situation in conventional illumination systems in which the field stop 82 commences opening at the beginning of the scan process. The process of consecutively switching on more and more rows $R_i$ is kept on until all n rows $R_1$ to $R_n$ of the light pattern LP shown in FIG. 7 are illuminated, as is shown in the right illustration of FIG. 8. This corresponds to the situation in conventional illumination systems in which the field stop 82 is completely open.

The scan process is then continued without amending the light pattern. Then the aforementioned process is reversed, i.e. the rows $R_1$ to $R_n$ are switched off one after another, beginning with the first row $R_1$ until only the last row $R_n$ is illuminated, see right illustration of FIG. 9. If the last row $R_n$ is switched off, the scan process is terminated.

The light entrance facets 92 of the remaining microlenses 88 may be illuminated just in the same manner as has been explained above with reference to FIGS. 7 to 9. Since each of the rows $R_1$ to $R_n$ receives the same number N of light pulses when the rows are switched on or off, it is ensured that each point on the mask 16 receives exactly the same number of light pulses during the whole scan process. The light source 30 should thus be synchronized with the mirror control 50 so as to make sure that the conditions with regard to the number of light pulses reliably prevail.

The switching on or off of the rows $R_1$ to $R_n$ can be easily achieved by setting deflection angles for the corresponding mirror elements $M_{ij}$ such that the spots to be switched on or off are either directed to the desired location, or are directed to a light absorbing surface outside the optical integrator 72, respectively. If a spot 90 has to be switched on or off, this involves moving the spot over the light entrance facet of the optical integrator 72. In order to avoid undesired perturbations, the spots 90 should be moved during the interval between successive light pulses. This involves very quick movements of the mirror elements $M_{ij}$.

2. Second Approach

Such quick movements of spots 90 over larger distances can be avoided if the spots 90 are not completely switched on or off, but are continuously moved over the light entrance facet 92 of a single first microlens 88.

Figure 10:
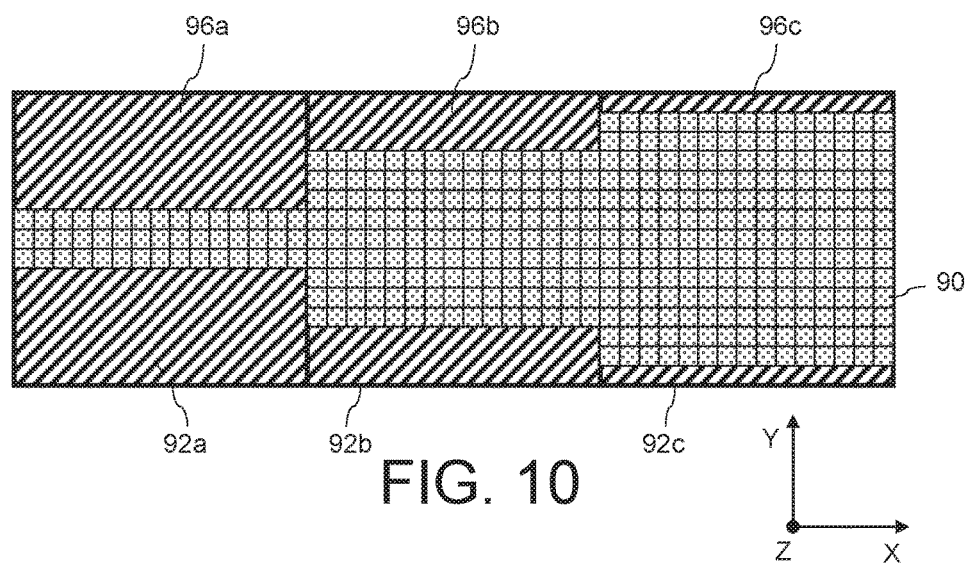
FIG. 10 is a top view on three adjacent light entrance facets illuminated with different light patterns.

This approach will be explained in the following with reference to FIGS. 10 to 12:

FIG. 10 is a top view on light entrance facets 92a, 92b, 92c of three adjacent first microlenses 88. Pairs of blinds 96a, 96b, 96c are fixedly attached to the light entrance facets 92a, 92b and 92c, respectively, such that a central stripe of different height along the scan direction Y remains uncovered. In this embodiment the pairs of blinds 96a, 96b, 96c are dimensioned such that the uncovered stripe in the middle is not restricted along the X direction, but only along the Y direction.

For the sake of simplicity it is assumed that one third of the light entrance facets 92 of the optical integrator 72 is provided with blinds 96a, one third with a blinds 96a and the remaining third with blinds 96c.

Figure 11A:
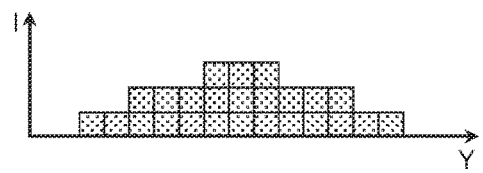
FIGS. 11a to 11d are schematic illustrations showing the intensity profile of the illuminated field along the scan direction.

FIG. 11a shows schematically the intensity distribution that is obtained in the intermediate field plane 80 if equal numbers of the three types 92a, 92b, 92c of light entrance facets are illuminated. The intensity profile along the Y direction increases until it reaches a top level and then decreases again. This approximates a trapezoidal intensity profile along the scan direction Y. If the number of different blinds 96a, 96b, 96c is increased, this approximation improves. The height and slope of the trapezoidal intensity profile are mainly determined by the distribution of blinds 96a, 96b, 96c.

Figure 11B:
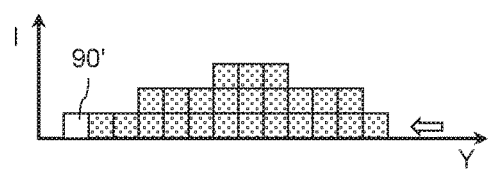
Figure 11C:
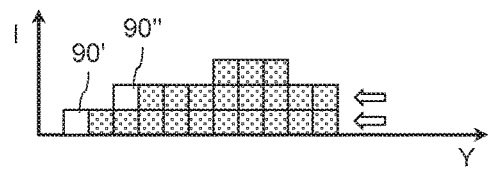
Figure 11D:
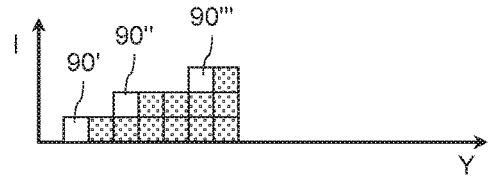

At the beginning and the end of the scan process the intensity profile along the scan direction Y has to be modified. FIGS. 11b, 11c and 11d illustrate how the intensity profile shown in FIG. 11a is gradually trimmed from the right side. The trimming process commences with moving the spots 90 along the scan direction Y on the light entrance facets 92c which are covered by a blind 96c. The row of spots 90 originally adjacent one of the blinds 96c will then be completely blocked by this blind, which is indicated in FIG. 11b by a white square 90'. This process is repeated, but this time also the spots 90 illuminated on light entrance facets 92b provided with blinds 96b are moved along the same direction. As a result, also a row of spots 90" is blocked by one of the blinds 96b. This situation is illustrated in FIG. 11c.

If the top level of the intensity profile is reached, also spots 90 on the light entrance facets 92a provided with blinds 96a will be moved along the scan direction Y. As a result, also a row of spots 90'" is blocked by one of the blinds 96a. This situation is illustrated in FIG. 11d. This process has to be repeated in reverse order from the opposite side at the beginning of a scan process.

The light entrance facets 92a, 92b, 92c covered with the different blinds 96a, 96b and 96c, respectively, should be distributed over the entrance surface of the optical integrator 72 such that adverse effects on the intensity distribution in the pupil surface 70 are minimized. Without such an optimized distribution it may happen that the illumination angle distribution, which corresponds to the light intensity distribution in the pupil surface 70, varies when spots 90 are moved along the scan direction Y during the beginning and end of the scan process.

Figures 12A, 12B, 12C:
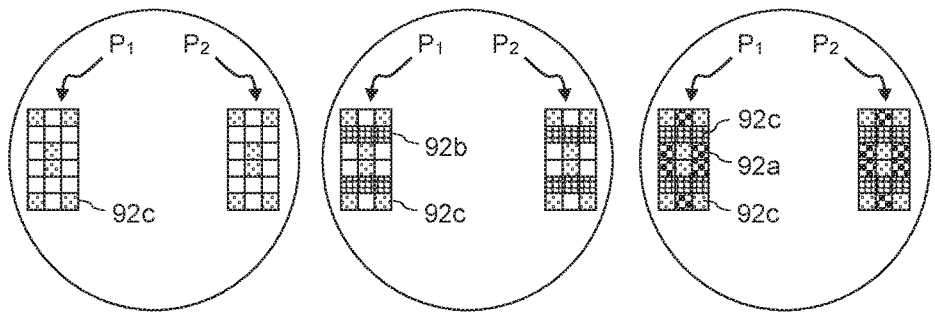
FIGS. 12a to 12c are top views on the optical raster element in which different numbers of light facets are illuminated with different light patterns.

FIGS. 12a to 12c illustrate this principle for a dipole illumination setting in which two poles P1, P2 are illuminated on the light entrance facet of the optical integrator 72. At the beginning and the end of the scan process only the light entrance facets 92c provided with blinds 96c contribute to the illumination of the mask 16. If the scan process continues, also the light entrance facets 92b provided with blinds 96b contribute to the illumination of the mask 16, see FIG. 12b. Finally also the light entrance facets 92a provided with blinds 96a contribute to the illumination of the mask 16, see FIG. 12c.

As can be seen in FIGS. 12a to 12c, the different types of light entrance facets 92a, 92b, 92c are distributed over the poles P1, P2 such that the switching on and off of the different types of the light entrance facets 92a, 92b, 92c does not significantly affect the intensity balance within each pole P1, P2. Such a balance could not be achieved if the different types of light entrance facets were arranged along three lines extending from the top to the bottom in FIGS. 12a to 12c, respectively.

This approach may be combined with the first approach if desired. Then a trapezoidal or any other non-rectangular intensity profile of the illuminated field 14 along the scan direction Y may be achieved, but without the blinds 96a, 96b, 96c. A row of spots 90, which shall be switch off, then does not move into a blind, but is switched off by moving the spots to an absorbing surface outside the optical integrator 72. It has only to be ensured that the time interval between two successive light pulses suffices to move the spots 90 to the absorbing surface.

3. Third Approach

Figure 13:
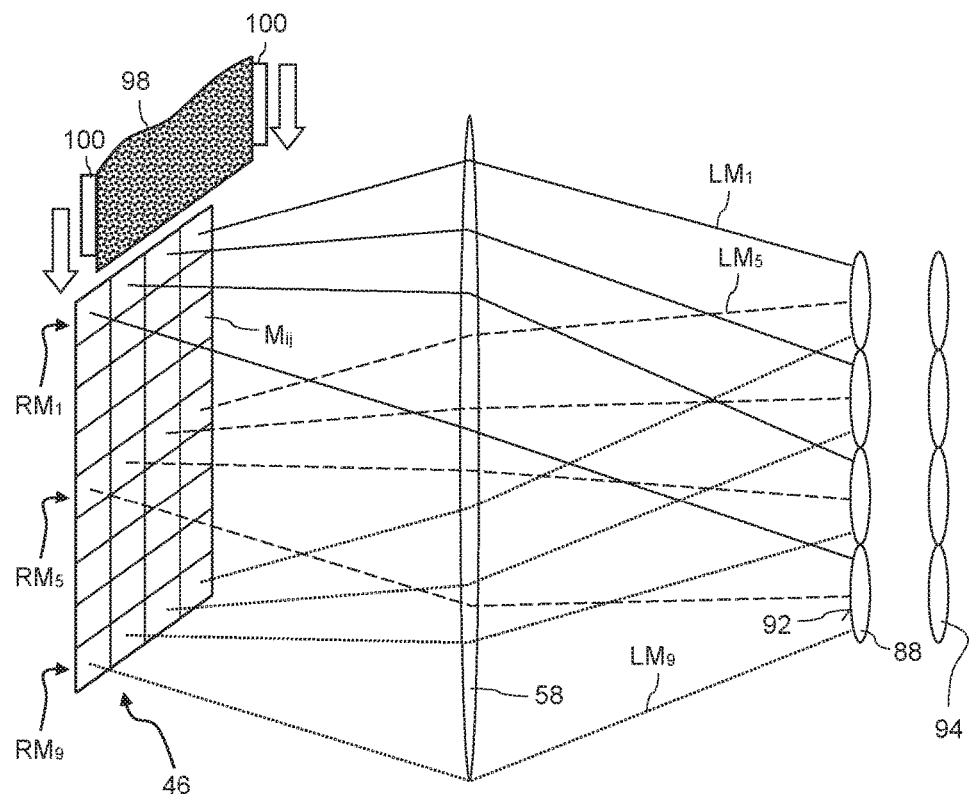
FIG. 13 is a partially perspective view of the mirror array, the condenser and first and second microlenses of the optical raster element, wherein a diaphragm starts moving into the path of light.

It is also possible to dispense only with the field stop objective 84 whilst using a movable stop blade at another location in the illumination system 12. This is schematically illustrated in FIG. 13 which is a cut-out of FIG. 2 showing the mirror array 46, the first condenser 58 and the optical integrator 72 with first microlenses 88 and second microlenses 94.

The solid lines indicate light rays $LM_1$ that emerge from micro-mirrors $M_{ij}$ of a first row $RM_1$ of micro-mirrors $M_{ij}$. The micro-mirrors $M_{ij}$ of this first row $RM_1$ are controlled such that they illuminate exclusively an upper portion of the light entrance facets 92 of the first microlenses 88 of the optical integrator 72. As a result, the light rays $LM_1$ illuminate a portion of the field 14 on the mask 16 which is closest to one of its edges.

The broken lines indicate light rays $LM_5$ which emerge from micro-mirrors $M_{ij}$ in a middle row $RM_5$ of the mirror array 46. The micro-mirrors $M_{ij}$ of this middle row $RM_5$ are controlled such that the light rays $LM_5$ illuminate only a middle portion of the light entrance facets 92 of the first microlenses 88. As a result, the light rays $LM_5$ illuminate a line crossing the centre of the field 14 illuminated on the mask 16.

The dotted lines indicate light rays $LM_9$ which emerge from micro-mirrors $M_{ij}$ of a last row $RM_9$ of micro-mirrors $M_{ij}$. The micro-mirrors $M_{ij}$ of this last row $RM_9$ are controlled such that the light rays $LM_9$ illuminate only a lower portion of the light entrance facets 92 of the first microlenses 88. As a result, the light rays $LM_9$ illuminate a portion of the field 14 illuminated on the mask 16 which is closest to an edge arranged opposite the edge illuminated by the light rays $LM_1$.

An opaque blade 98 is arranged in immediate vicinity to the micro-mirror array 46 such that it can be moved, with the help of actuators 100, during a scan process along the scan direction Y. If the blade 98 starts moving downwards as indicated by arrows in FIG. 13, it will first obstruct the light rays $LM_1$ emerging from the micro-mirrors $M_{ij}$ of the first row $RM_1$ of micro-mirrors $M_{ij}$. Consequently, the field 14 illuminated on the mask 16 will be trimmed from the Y direction. The blade 98 will then block light rays emerging from the neighboring row $RM_2$ of micro-mirrors $M_{ij}$, which results in a further trimming of the illuminated field 14, and so on.

When the blade 98 keeps on moving until it reaches the middle row $RM_5$, the field 14 illuminated on the mask 16 will have only half of its original length along the scan direction Y.

It is thus possible, by appropriately selecting the mirror element $M_{ij}$ that illuminate certain portions of the light entrance facets 92 of the first microlenses 88, to vary the geometry of the field 14 illuminated on the mask 16 by obstructing mirror elements $M_{ij}$ with the help of an opaque blade or another diaphragm.

V. Operating Method

Figure 14:
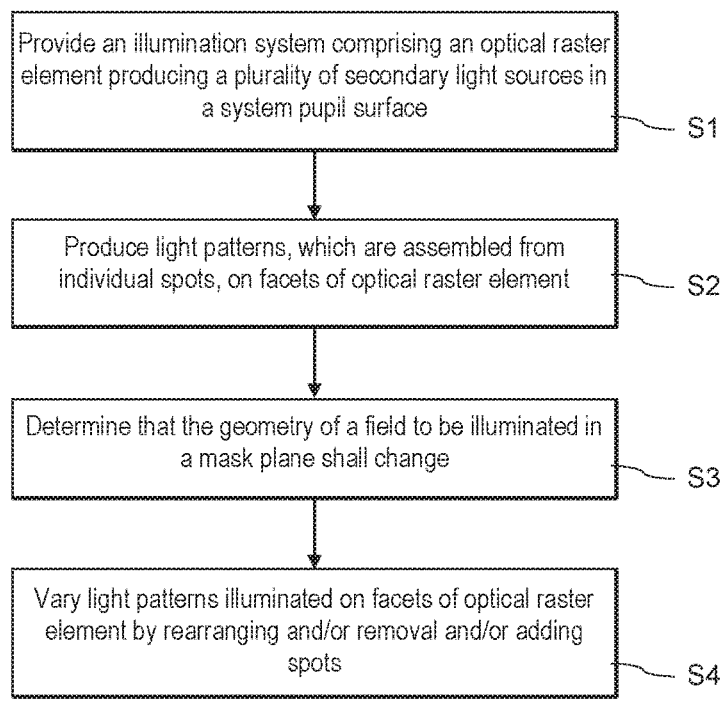
FIG. 14 is a flow diagram of a method of operating an illumination system of a microlithographic projection exposure apparatus according to the disclosure.

FIG. 14 is a flow diagram illustrating the main steps of a method of operating an illumination system of a microlithographic projection exposure apparatus in accordance with the present disclosure.

In a first step S1 the illumination system 12 of the microlithographic projection exposure apparatus 10 is provided. The illumination system 12 includes the optical raster element 72 having a plurality of light entrance facets 92.

In a step S2 light patterns, which are assembled from individual spots 90, are produced on the light entrance facets 92 of the optical raster element 72.

In a step S3 it is determined that the geometry of the field 14 to be illuminated in the mask plane 86 shall change. A reason for doing this may be the change of the mask 16, or a scan process which makes it desirable to open and shut the illuminated field 14 at the beginning and the end of the scan process, respectively.

Then the light patterns on the light entrance facets 92 are varied by rearranging and/or removal and/or adding spots, as previously described.

The above description of the preferred embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. An illumination system, comprising:
   an optical raster element comprising a plurality of light entrance facets;
   a beam deflecting device comprising an array of reflective or transparent beam deflecting elements; and
   a control unit configured to control the beam deflecting elements,
   wherein the illumination system is configured so that during use of the illumination system:
   points on the light entrance facets are imaged onto a mask plane;
   the control unit individually controls each beam deflecting element so that, when projection light illuminates the beam deflecting element, the beam deflecting element illuminates: a) a light spot on one of the light entrance facets; or b) no light spot on any of the light entrance facets;
   the control unit controls the beam deflecting elements so that the beam deflection elements partially illuminate a light entrance facet with light spots while a length of a light pattern assembled from the light spots varies gradually along a scan direction of the illumination system during a scan process; a length of the light pattern along a direction perpendicular to the scan direction is constant during the scan process; and
   the illumination system is configured to be used in a microlithographic projection exposure apparatus.

2. The illumination system of claim 1, wherein all the light spots have an at least substantially rectangular geometry.

3. The illumination system of claim 1, wherein, at a given instant during the scan process, the light patterns produced on all illuminated light entrance facets are identical.

4. The illumination system of claim 1, wherein the control unit is configured to control the beam deflection elements so that, at a given instant during the scan process, the light patterns have different lengths along the scan direction.

5. The illumination system of claim 1, wherein the optical raster element comprises an array of refractive or diffractive micro-elements, and each micro-element is associated with one light entrance facet.

6. The illumination system of claim 1, wherein the control unit is configured to control the beam deflection elements so that during the scan process rows of adjacent light spots are simultaneously illuminated or made dark again on at least one of the light entrance facets.

7. An apparatus, comprising:
an illumination system according to claim 1; and
a projection objective,
wherein the apparatus is a microlithographic projection exposure apparatus.

8. An illumination system, comprising:
an optical raster element comprising a plurality of light entrance facets;
a beam deflecting device comprising an array of mirrors, each mirror being tiltable by a tilt axis, each mirror being configured to produce a light spot on one of the light entrance facets; and
a control unit configured to control the mirrors,
wherein during use of the illumination system:
points on the light entrance facets are imaged onto a mask plane;
the control unit control the mirrors so that the mirrors partially illuminate a light entrance facet with light spots while a length of a light pattern assembled from the light spots varies gradually along a scan direction of the illumination system during a scan process;
a length of the light pattern along a direction perpendicular to the scan direction is constant during the scan process; and
the illumination system is configured to be used in a microlithographic projection exposure apparatus.

9. The illumination system of claim 8, wherein all the light spots have an at least substantially rectangular geometry.

10. The illumination system of claim 8, wherein, at a given instant during the scan process, the light patterns produced on all illuminated light entrance facets are identical.

11. The illumination system of claim 8, wherein the control unit is configured to control the mirrors so that, at a given instant during the scan process, the light patterns have different lengths along the scan direction.

12. The illumination system of claim 8, wherein the optical raster element comprises an array of refractive or diffractive micro-elements, and wherein each micro-element is associated with one light entrance facet.

13. The illumination system of claim 8, wherein the control unit is configured to control the mirrors so that during the scan process rows of adjacent light spots are simultaneously illuminated or made dark again on at least one of the light entrance facets.

14. The illumination system of claim 8, wherein the mirrors are configured to be tilted individually.

15. An apparatus, comprising:
an illumination system according to claim 8; and
a projection objective,
wherein the apparatus is a microlithographic projection exposure apparatus.

16. An illumination system comprising:
an optical integrator, comprising:
a first substrate;
a first array comprising first refractive or diffractive micro-elements on the first substrate, the first refractive or diffractive micro-elements having light entrance facets;
a second substrate; and
a second array comprising second refractive or diffractive micro-elements on the second substrate;
a beam deflecting device comprising an array of reflective or transparent beam deflecting elements; and
a control unit configured to:
individually control each beam deflecting element so that, when projection light illuminates the beam deflecting element, the beam deflecting element illuminates: a) a light spot on one of the light entrance facets; or b) no light spot on any of the light entrance facets; and
control the beam deflecting elements so that variable light patterns assembled from the light spots are formable within one of the light entrance facets,
wherein the illumination system is configured to be used in a microlithographic projection exposure apparatus.

17. The illumination system of claim 16, wherein all light spots have an at least substantially rectangular geometry.

18. The illumination system of claim 16, wherein, at a given instant during a scan process, the light patterns produced on all illuminated light entrance facets are identical.

19. The illumination system of claim 16, wherein the control unit is configured to control the beam deflection elements so that, at a given instant during the scan process, the light patterns have different lengths along a scan direction.

20. The illumination system of claim 16, wherein the control unit is configured to control the beam deflection elements so that during a scan process rows of adjacent light spots are simultaneously illuminated or made dark again on at least one of the light entrance facets.

21. An apparatus, comprising:
an illumination system according to claim 16; and
a projection objective,
wherein the apparatus is a microlithographic projection exposure apparatus.

* * * * *

UNITED STATES PATENT AND TRADEMARK OFFICE
CERTIFICATE OF CORRECTION

PATENT NO.         : 9,523,923 B2                                                    Page 1 of 1
APPLICATION NO.    : 14/274129
DATED              : December 20, 2016
INVENTOR(S)        : Markus Deguenther It is certified that error appears in the above-identified patent and that said Letters Patent is hereby corrected as shown below:

In the Specification

Column 4, Line 49, delete "micro-lenses" and insert -- microlenses --.

Signed and Sealed this
Eighteenth Day of April, 2017

Michelle K. Lee
*Director of the United States Patent and Trademark Office*